United States Patent [19]

Yoshinaga et al.

[11] Patent Number: 5,422,204
[45] Date of Patent: Jun. 6, 1995

[54] PHOTO-CROSSLINKABLE RESIN COMPOSITION AND HOLOGRAM RECORDING MEDIUM

[75] Inventors: Yoko Yoshinaga, Machida; Shin Kobayashi, Atsugi; Susumu Matsumura, Kawaguchi; Naosato Taniguchi, Machida; Toshiyuki Sudoh; Hideki Morishima, both of Atsugi, all of Japan

[73] Assignee: Canon Kabushiki Kaisha, Tokyo, Japan

[21] Appl. No.: 913,815

[22] Filed: Jul. 16, 1992

[30] Foreign Application Priority Data

| Jul. 19, 1991 | [JP] | Japan | 3-203780 |
| Jul. 19, 1991 | [JP] | Japan | 3-203781 |
| Dec. 5, 1991 | [JP] | Japan | 3-348421 |

[51] Int. Cl.⁶ ........................... G03C 1/73
[52] U.S. Cl. ........................... 430/2; 430/281; 430/282; 522/15; 522/25; 522/26; 522/30
[58] Field of Search ........... 430/1, 2, 281, 282; 522/15, 25, 26, 30; 359/3

[56] References Cited

U.S. PATENT DOCUMENTS

| 3,640,718 | 2/1972 | Smith | 522/30 |
| 4,250,053 | 2/1981 | Smith | 430/281 |
| 4,307,177 | 12/1981 | Crivello | 430/281 |
| 4,517,266 | 5/1985 | Ikegami et al. | 430/1 |
| 4,868,092 | 9/1989 | Kawabata et al. | 522/14 |
| 4,908,285 | 3/1990 | Kushibiki et al. | 430/1 |
| 4,921,827 | 5/1990 | Ali et al. | 522/14 |
| 4,965,171 | 10/1990 | Kawabata et al. | 430/281 |
| 4,994,347 | 2/1991 | Smothers | 430/2 |
| 5,102,775 | 4/1992 | Okuhara et al. | 522/25 |
| 5,154,994 | 10/1992 | Yamagishi et al. | 430/2 |

FOREIGN PATENT DOCUMENTS

| 0349982 | 7/1989 | European Pat. Off. |
| 0386780 | 3/1990 | European Pat. Off. |
| 0435262 | 12/1990 | European Pat. Off. |
| 15268 | 1/1990 | Japan |
| 15269 | 1/1990 | Japan |
| 136857 | 5/1990 | Japan |
| 136858 | 5/1990 | Japan |
| 242817 | 9/1990 | Japan |

OTHER PUBLICATIONS

J. V. Crivello, Journal of the Electrochemical Society, "Novel Negative Working Photoresists," vol. 136, No. 5, May 1989, pp. 1453–1456.

Primary Examiner—Charles L. Bowers, Jr.
Assistant Examiner—Martin J. Angebranndt
Attorney, Agent, or Firm—Fitzpatrick, Cella, Harper & Scinto

[57] ABSTRACT

A photo-crosslinkable resin composition comprises (a) a polymer having an electron-donating group in a monomer unit, (b) a halogen compound, (c) an onium salt and (d) at least one sensitizer selected from the group consisting of coumarin derivatives, rhodanine derivatives, thioxanthene derivatives and unsaturated cyclopentanone compounds. The composition can be used as a hologram recording medium.

20 Claims, 2 Drawing Sheets

PHOTO-CROSSLINKABLE RESIN COMPOSITION AND HOLOGRAM RECORDING MEDIUM

BACKGROUND OF THE INVENTION

1. Field of the Invention

The present invention relates to a photo-crosslinkable resin composition, a hologram recording medium mainly comprising the photo-crosslinkable resin composition, and a hologram recording method using the hologram recording medium. More specifically, it relates to a photo-crosslinkable resin composition and a hologram recording medium having excellent shelf stability and high sensitivity, as well as a hologram recording method by which an excellent volume phase hologram having sufficient durability is provided.

2. Related Background Art

Holography is a technique in which a fringe pattern is constructed in a recording medium by two coherent laser beams and phase or amplitude modulation is added to incident light.

With the advancement of the research regarding the above-mentioned holography technique, various recording media have been suggested, and as materials for use in the recording medium, there have been reported bleached silver salts, dichromated gelatin, thermoplastics, polymeric liquid crystals, inorganic glass materials, ferroelectrics, photopolymers and the like.

Heretofore, as the recording medium by which the high-performance volume phase hologram can be recorded, gelatin sensitized with the dichromate has been well known and used.

This kind of dichromated gelatin recording medium is indeed excellent in that it permits the recording of optical properties with high sensitivity, but the medium has a shortcoming, in that heat resistance, environmental resistance and, particularly, moisture resistance are poor and the formed fringe pattern easily disappears due to the absorption of moisture. Therefore, it is desired to sufficiently enhance the moisture resistance of the hologram. For example, when applied to laser beam-protective spectacles for protecting eyes from laser beams, head-up display devices for cars and the like, the hologram is required to be hermetically sealed with a glass plate or a kind of sealant, and therefore the dichromated gelatin recording medium is unsatisfactory with respect to processability, safety, weight and the like.

In order to overcome the drawbacks of the dichromated gelatin recording medium, photopolymers and the like have been suggested in Japanese Patent Kokai Nos. 2-242817 and 1-502060 and other publications.

These photopolymers are all formed by polymerizing a monomer in a polymer binder, and therefore in the case of a solid phase polymerization, the environmental resistance deteriorates owing to the unreacted monomer. Furthermore, in the reflection hologram, distance of fringe pattern is narrower than in the transmission hologram, and thus, there is a problem that a monomer having a high monomer volume contraction in polymerization is not applicable.

For the purpose of resolving the above-mentioned problems, a technique has been suggested in which a polymer having an aromatic group in a monomer unit, such as poly(vinyl carbazole) (PVCz), is crosslinked by a halogen compound, followed by a development step, to form the hologram (Japanese Patent Kokai No. 2-15269). The PVCz recording medium can provide a volume phase hologram having very excellent moisture resistance, weathering resistance and the like.

However, in the hologram manufacturing process using the PVCz recording medium, there is a problem that a photosensitive solution comprising poly(vinyl carbazole) and carbon tetraiodide has a short pot life, in other words, a problem that the crosslinking reaction of the poly(vinyl carbazole) with carbon tetraiodide tends to proceed not through exposure to a radiation ray, but through exposure to heat. In consequence, the photosensitive solution must be prepared each time coating is to be carried out, and much attention must be paid to the viscosity and sensitivity of the photosensitive solution, as well as to the thickness of the coating film.

In addition, it has been also reported that a halide can be used as a crosslinking agent, and a sensitizing agent such as a cyanine dye or a styryl dye, can be combined with the halide (Japanese Patent Kokai Nos. 2-136858 and 2-136857).

However, these sensitizing agents still have a low sensitivity as regards the desired exposure wave length, and further improvement of the sensitivity is required. Moreover, these sensitizing dyes have a counter anion, and so they show low solubility in an organic solvent, particularly an aromatic solvent which is a good solvent for PVCz. Accordingly, these sensitizing agents are not satisfactory in terms of their solubility in the photosensitive solution.

SUMMARY OF THE INVENTION

Therefore, an object of the present invention is to provide a stably storable and high-sensitive photo-crosslinkable resin composition, and a hologram recording medium using the same, by which the above-mentioned problems of conventional techniques can be solved, and another object of the present invention is to provide a hologram recording method that yields a volume phase hologram having sufficient durability.

The above-mentioned objects can be accomplished by the present invention.

That is, the first aspect of the present invention is directed to a photo-crosslinkable resin composition comprising (a) a polymer having an electron-donating group in a monomer unit, (b) a halogen compound and (c) at least one sensitizer selected from the group consisting of coumarin derivatives, rhodanine derivatives, thioxanthene derivatives and unsaturated cyclopentanone compounds.

The second aspect of the present invention is directed to a photo-crosslinkable resin composition comprising (a) a polymer having an electron-donating group in a monomer unit, (b) an onium salt and (c) at least one sensitizer selected from the group consisting of coumarin derivatives, rhodanine derivatives, thioxanthene derivatives and unsaturated cyclopentanone compounds.

The third aspect of the present invention is a photo-crosslinkable resin composition comprising (a) a polymer having an electron-donating group in a monomer unit, (b) a halogen compound, (c) an onium salt and (d) at least one sensitizer selected from the group consisting of coumarin derivatives, rhodanine derivatives, thioxanthene derivatives and unsaturated cyclopentanone compounds.

The fourth aspect of the present invention is directed to a hologram recording medium containing as the main component a photo-crosslinkable resin composition comprising (a) a polymer having an electron-donating group in a monomer unit, (b) a halogen compound and (c) at least one sensitizer selected from the group consisting of coumarin derivatives, rhodanine derivatives, thioxanthene derivatives and unsaturated cyclopentanone compounds.

The fifth aspect of the present invention is directed to a hologram recording medium containing as the main component a photo-crosslinkable resin composition comprising (a) a polymer having an electron-donating group in a monomer unit, (b) an onium salt and (c) at least one sensitizer selected from the group consisting of coumarin derivatives, rhodanine derivatives, thioxanthene derivatives and unsaturated cyclopentanone compounds.

The sixth aspect of the present invention is directed to a hologram recording medium containing as the main component a photo-crosslinkable resin composition comprising (a) a polymer having an electron-donating group in a monomer unit, (b) a halogen compound, (c) an onium salt and (d) at least one sensitizer selected from the group consisting of coumarin derivatives, rhodanine derivatives, thioxanthene derivatives and unsaturated cyclopentanone compounds.

The seventh aspect of the present invention is directed to a hologram recording method containing a step of exposing a hologram recording medium mentioned above in the fourth, fifth or sixth aspect to a visible ray.

BRIEF DESCRIPTION OF THE DRAWINGS

○: Example 8
△: Example 9
□: Example 10
✕: Comparative Example 1

DETAILED DESCRIPTION OF THE PREFERRED EMBODIMENTS

The present inventors have investigated organic halogen compounds for their effects on a polymer having an electron-donating group in a monomer unit, and, as a result, they have found that when a halogen compound such as iodoform or carbon tetrabromide which is more stable than carbon tetraiodide to heat and light is used as a crosslinking agent, and together with this crosslinking agent a sensitizer is added to a recording medium, a photosensitive region can be enlarged and sensitivity can be increased, even in an Ar laser beam wave range where absorption due to a charge-transfer complex of carbazole and an organic halogen compound is very weak. The present invention has been completed on the basis of this knowledge.

Furthermore, the present inventors have investigated the photo-crosslinking properties of a polymer having side chains when an onium salt is added to the polymer. As a result, only when the polymer having an electron-donating group in a monomer unit was used, did a photo-crosslinking reaction take place. In addition, when the sensitizer was added, the photosensitive region could be enlarged. Thus, the present invention has been completed.

In general, it is known that the sensitization of from the sensitizer to the onium salt is due to one electron transfer, and according to the formula of Rehn and Weller, the free energy of the electron transfer reaction can be estimated from the oxidation potential of the sensitizer, the reduction potential of the crosslinking agent and the excitation energy of the sensitizer. This can be presumed to be similarly applied to the halogen compound having an electron accepting property.

It has been apparent that in the sensitization of the present invention, every free energy is negative and one electron is possibly transferred. Moreover, the results showed that another factor can enhance the sensitivity for the dye in addition to the negative free energy.

That is, it has been found that the sensitivity can be enhanced by adding a sensitizer having a cyclic amino group, particularly a julolidine group. Furthermore, it has been found that when the onium salt and the halogen compound are simultaneously used as the crosslinking agents in this system, the sensitivity can be further increased, and the present invention has been achieved.

The reason why the simultaneous employment of the onium salt and the halogen compound results in an increase of the sensitivity may not be known for certain, but in the visible absorption spectrum change for the photoreaction film, the system comprising the onium salt and the halogen compound shows a different pattern in decreasing the sensitizer peak and in increasing the photoreaction product peak, compared with the system comprising only one of the onium salt and the halogen compound. Therefore, it can be supposed that a different reaction mechanism, inclusive of the reaction of the onium salt and the halogen compound, is involved and that this reaction mechanism might cause the reactivity to increase.

The reason why the photo-crosslinking reaction takes place only with in the electron-donating polymer likewise may not be known for certain, but it can be presumed that the crosslinking reaction via a charge-transfer complex and an electron-transfer reaction occurs as in the system comprising poly(vinyl carbazole) and carbon tetraiodide.

Next, the present invention will be described in detail with reference to preferable embodiments.

Typical examples of the polymer having an electron-donating group in a monomer unit which is the principal component of the photo-crosslinkable resin composition and the hologram recording medium of the present invention include poly(vinyl carbazole), 3-chlorovinyl carbazole polymer, 3-bromovinyl carbazole polymer, 3-iodovinyl carbazole polymer, 3-methylvinyl carbazole polymer, 3-ethylvinyl carbazole polymer, chlorinated poly(vinyl carbazole) and brominated poly(vinyl carbazole) which have an electron-donating aromatic ring and polymers comprising monomers represented by the following structural formulae.

(1)

(2)

(3)

(4)

(5)

(R = H, —CH$_3$, —C$_2$H$_5$, —C$_3$H$_7$, —CH(CH$_3$)C$_2$H$_5$)

(6)

In the above-mentioned formula (6), the following combinations of X and n are present, and the four kinds of compounds are included.

n=1 and X=—COOCH$_2$CH$_2$—
n=2 and X=—COOCH$_2$CH$_2$—
n=4 and X=—NHCO—
n=1 and X=—SCH$_2$CH$_2$—

(7)

(8)

(9)

(10)

Furthermore, other examples of the polymer having an electron-donating group in a monomer unit include polystyrene having a halogen (—Cl, —Br or —I) at a para-position, p-amino, p-dimethylamino, p-methoxy or p-OH, poly(N-vinylindole), poly(N-vinylpyrrole), poly-(N-vinylphenothiazine), poly(isopropenylphenol) and poly-[4-N,N-diphenylamino)phenylmethyl methacrylate].

The above-mentioned polymers may be each copolymerized with another monomer, if necessary, to control characteristics such as strength and flexibility of formed films.

Examples of the other monomer which can be used in such an application include, in addition to the above-mentioned vinyl carbazoles, olefins, vinyl esters such as vinyl acetate, esters of acrylic acid and methacrylic acid, and vinyl monomers such as styrene and styrene derivatives which can be copolymerized by a copolymerization process in accordance with a radial polymerization.

Additionally, there may be blended other polymers such as polystyrene, styrene-butadiene copolymer, styrenehydrogenated butadiene copolymer, polycarbonate, polyacrylate, polyvinyl butyral and polyvinyl acetate, so long as they do not impair the photo-crosslinking properties. The addition ratio of these polymers can be selected so as to obtain desired characteristics.

The above-mentioned polymer component which is the principal component of the photo-crosslinkable resin composition or the hologram recording medium of the present invention is required to be activated to radiant rays by the photo-decomposable onium salt or halogen compound. Examples of the photo-decomposable onium salt include diaryliodonium salts, diarylbromonium salts and diarylchloronium salts, and typical examples thereof include compounds represented by the following formula (A).

(A)

wherein each of X and X' is t-butyl, —CH$_3$, —CH$_2$CH$_3$, —CH$_2$CH$_2$CH$_3$, —F, —Cl, —Br or —OCH$_3$ (however X=X' or X≠X'); Y is I, Br or Cl; and Z is I$^-$, BF$_4^-$ PF$_6^-$, SbF$_6^-$, CF$_3$SO$_3^-$ or AsF$_6^-$.

Furthermore, compounds represented by the formula (A') are most preferable.

(A')

wherein each of X and X' is t-butyl, —CH$_3$, —CH$_2$CH$_3$, —CH$_2$CH$_2$CH$_3$, —F, —Cl, —Br or —OCH$_3$ (however X=X' or X≠X'); Y is I, Br or Cl; and Z is I$^-$, BF$_4^-$, PF$_6^-$, SbF$_6^-$, CF$_3$SO$_3^-$ or AsF$_6^-$.

Each onium salt can be added to the above-mentioned polymer in a ratio of 1 to 100% by weight, preferably 2 to 25% by weight based on the weight of the polymer.

Typical examples of the halogen compound which can be used in the present invention include iodine compounds and bromine compounds such as iodoform, ethylene tetraiodide, triiodoethane, tetraiodoethane, pentaiodoethane, hexaiodoethane, carbon tetrabromide and ethylene tetrabromide which are more stable than carbon tetraiodide. Furthermore, each halogen compound can be added to the above-mentioned polymer in a ratio of 1 to 50% by weight, preferably 3 to 20% by weight, based on the weight of the polymer.

In the system in which the onium salt and the halogen compound are used together, the content ratio of the onium salt to the halide is effectively in the range of 1:20 to 20:1, and more preferably in the range of 1:10 to 2:1.

In the present invention, examples of the sensitizer which permits increasing a photosensitive region to long wave length and enhancing sensitivity include rhodanine derivatives, unsaturated cyclopentanone compounds, coumarin derivatives and thioxanthene dyes.

Typical examples of the coumarin derivatives are as follows:

(1)

(2)

(3)

(4): X = —NH—
(5): X = —O—
(6): X = —S—

(7)

X = —NH—
X = —O—
X = —S—

(8)

(9)

-continued

Typical examples of the thioxanthene derivatives as follows:

-continued

Typical examples of the rhodanine derivatives are as follows:

-continued

Typical examples of the unsaturated ketone compounds are as follows:

Among these sensitizers, the coumarins and the unsaturated cyclopentanone compounds having cyclic amine groups such as julolidine, piperidine and pyrrolidine are preferable, and the coumarins and the unsaturated cyclopentanone compounds having the julolidine group are more preferable.

Each of these sensitizers is added to the above-mentioned polymer in a ratio of 0.01 to 10% by weight, preferably 0.1 to 5% by weight, based on the weight of the polymer.

The photo-crosslinkable resin composition of the present invention can be obtained by dissolving the above-mentioned necessary components in a suitable solvent at one time or in succession.

Considering the solubility of the polymer, the sensitizer and the crosslinking agent, as well as the boiling point of the solvent and the like, particularly preferable examples of the organic solvent which can be used in this step include benzene, xylene, chlorobenzene, chloroform, dichloroethane, dichloroethylene, trichloroethylene, pyridine, dioxane, tetrahydrofuran and mixtures thereof. In the case of the polymer having a hydrophilic group, such as styrene having —OH at a p-position, methanol or ethanol can be preferably used.

The viscosity of the thus-obtained photo-crosslinkable resin composition solution of the present invention depends upon the concentration and molecular weight of the polymer, but it is preferably from 50 to 5,000 cps, more preferably from 300 to 2,000 cps at 20° C.

No particular restriction is put on a technique for dissolving the polymer, and a usual dissolving operation is applicable which comprises pouring the polymer into an organic solvent, heating it if necessary, filtering the solution to remove insolubles therefrom, and then allowing it to stand, so that air bubbles are removed from the solution.

The thus-obtained photo-crosslinkable resin composition of the present invention has its sensitivity in a visible band. This kind of composition is preferably stored in the dark.

The hologram recording medium of the present invention can be obtained by coating a suitable substrate such as a glass plate or a plastic film with the above-mentioned photo-crosslinkable resin composition of the present invention.

Furthermore, the fringe pattern in the hologram recording medium is constructed by two coherent laser beams of object and reference light in accordance with the photosensitive region of the sensitizer, whereby a latent image of the volume phase hologram is formed.

Afterward, according to a procedure containing a development step in which a swelling phenomenon and a shrinking phenomenon attributable to a solvent are utilized, the volume phase hologram having a high resolution and a high diffraction efficiency can be formed.

After the exposure step, the hologram recording medium is immersed in a solvent which does not dissolve the above-mentioned polymer in the recording medium composition or the photo-crosslinked polymer, whereby the sensitizer and the unreacted or decomposed crosslinking agent alone can be dissolved and removed from the recording medium, with the result that the recording medium can be decolored. Incidentally, this step can be performed together with the undermentioned swelling step.

The next part of the developing process comprises a swelling step and a shrinking step.

That is, in the swelling step for the recording medium using the first solvent, the recording medium on which the hologram latent image has been formed in the exposure step, and from which the sensitizer and the crosslinking agent have been removed, is treated with a swelling solvent, the first solvent, so that the recording medium is swelled in compliance with a formed fringe pattern. Afterward, in the shrinking treatment by the use of the second solvent, the swelled recording medium is shrunk to amplify and form the hologram.

Examples of the swelling solvent, the first solvent for use in the hologram development step, include benzene and naphthalene derivatives such as benzene, toluene, xylene (ortho-, meta- or para-isomer, or a mixture thereof), ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene; halogen-substituted saturated and unsaturated hydrocarbons such as dichloromethane, chloroform, trichloroethylene, trichloroethane, dichloroethane and bromoform; ketones such as acetone, methyl ethyl ketone, methyl isobutyl ketone and cyclohexanone; esters such as ethyl acetate and ethyl formate; amines; and amides.

Particularly when poly(vinyl carbazole) or its derivative is used as a polymer, examples of the preferable swelling solvent include benzene derivatives and naphthalene derivatives such as benzene, toluene, xylene (ortho-, meta- or para-isomer, or a mixture thereof), ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene.

As, as a shrinking solvent, which is the second solvent, there can be used solvents which neither swell nor dissolve the hologram recording medium, and which are compatible with the above-mentioned swelling solvent. Preferable examples of the shrinking solvent include alkanes and cycloalkanes such as n-pentane, n-hexane, n-heptane, n-octane, isooctane and cyclohexane; alcohols such as methyl alcohol, ethyl alcohol, n-propyl alcohol, isopropyl alcohol, n-butyl alcohol, tert-butyl alcohol, n-amyl alcohol and isoamyl alcohol; ethers such as diethyl ether, methyl ethyl ether and diisopropyl ether.

Above all, the saturated hydrocarbons having 5 to 7 carbon atoms are excellent in shrinking effect, and they can be suitably used in the shrinking step singly or in the form of a mixture prepared by mutually mixing them or by mixing one of them and another solvent.

In addition, treatment conditions such as temperature, time, and the like, in the respective steps depend upon the kinds of recording medium and solvent which are to be used, and so they cannot be determined generally. Usually in every step, the treatment at a temperature of about 10° to 70° C. for a period of several seconds to several minutes permits the obtaining of a sufficient effect.

EXAMPLES

Now, the present invention will be described in more detail with reference to specific examples.

Examples 1 to 5

2.5 g of poly(vinyl carbazole), 0.15 g of iodoform and 0.1 g of each sensitizer shown in Table 1 were dissolved in 60 g of monochlorobenzene in dark to form solutions, whereby photo-crosslinkable resin compositions of Examples 1 to 5 regarding the present invention were obtained.

Figure 1:
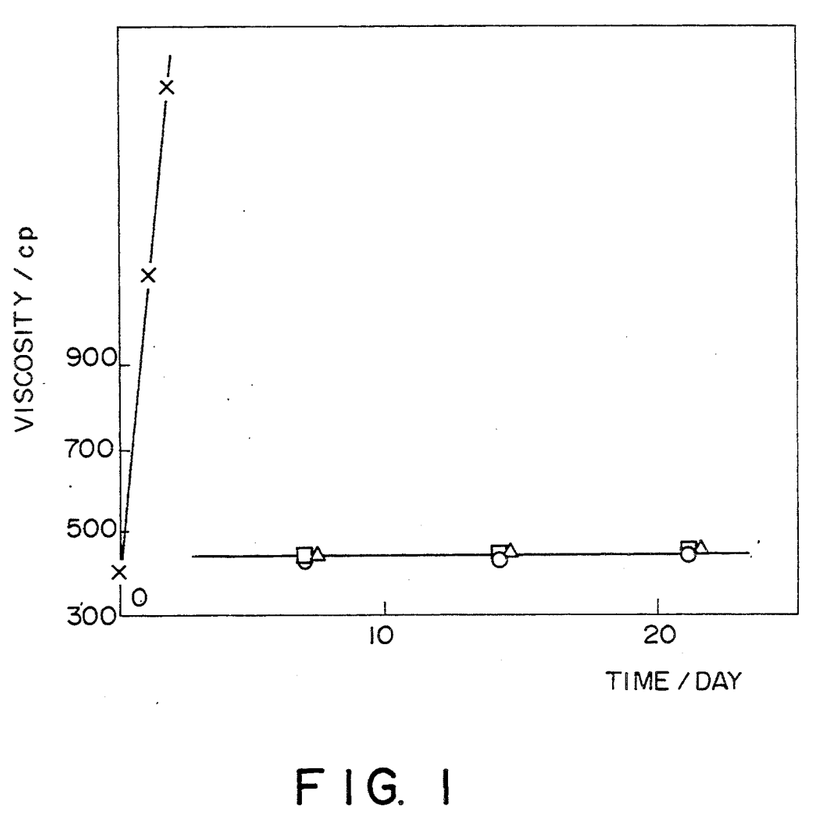
FIG. 1 shows changes in the viscosity of photo-crosslinkable resin compositions over time, at ordinary temperature in the dark, in Examples 8 to 10 of the present invention and Comparative Example 1. The symbols in FIG. 1 represent the viscosities of the photo-crosslinkable resin compositions as follows.
Figure 2:
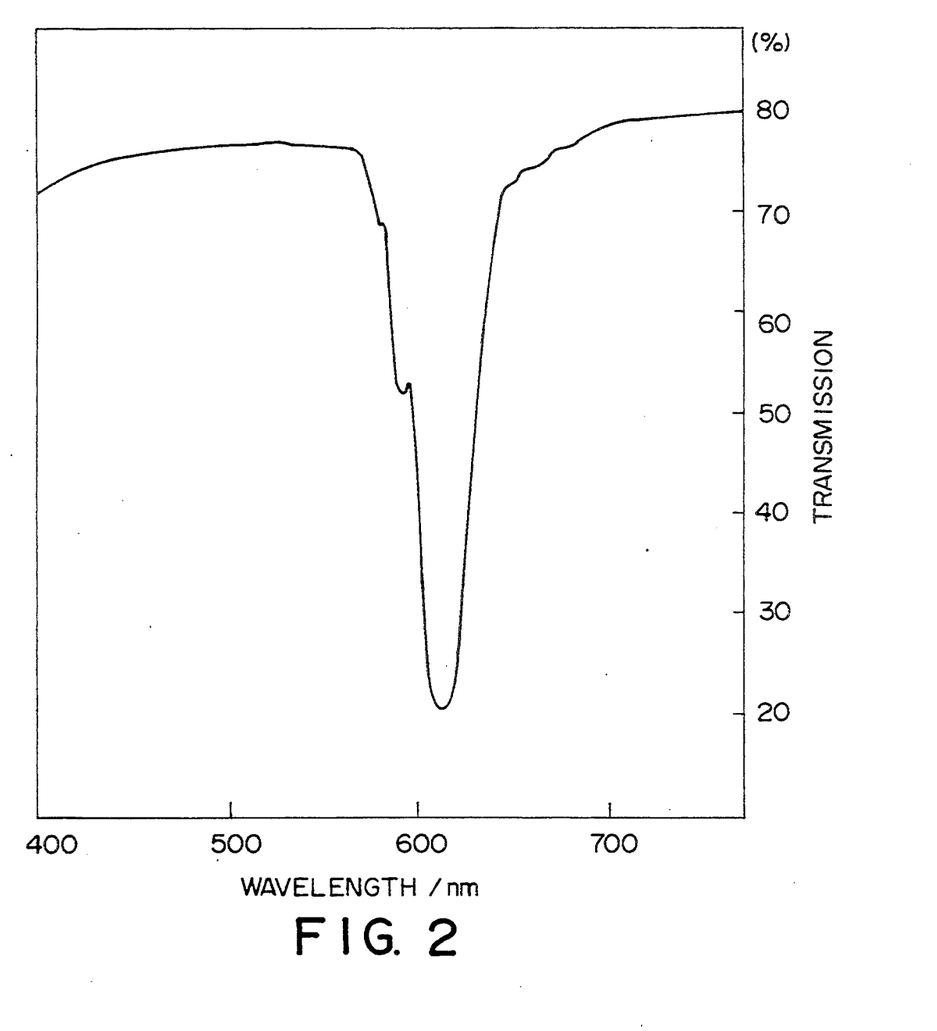
FIG. 2 shows wave length dependence regarding the transmission spectrum of a reflection hologram in one example of the present invention.

In order to check the dark reactivity of these solutions, the time dependence of solution viscosity was measured by the use of a rotary viscometer (VISCONIC ELD, E type, 3° cone). The viscosity did not change at 450±20 cp for 200 hours.

TABLE 1

| Example | Sensitizer |
| --- | --- |
| 1 | [structure] |
| 2 | [structure] |

TABLE 1-continued

| Example | Sensitizer |
|---------|------------|
| 3 | (CH₃CH₂)₂N—C₆H₄—CH=C(C=O cyclopentane)=CH—C₆H₄—N(CH₂CH₃)₂ |
| 4 | (coumarin-thiazole-coumarin structure with N(C₂H₅)₂ group) |
| 5 | (polycyclic ketone with phenyl, S, and EtO substituents) |

Examples 6 and 7

3 g of poly(vinyl carbazole), 0.15 g of each onium salt and 0.1 g of each sensitizer shown in Table 2 were dissolved in 60 g of monochlorobenzene in the dark to form solutions, whereby photosensitive resin compositions of Examples 6 and 7 regarding the present invention were obtained.

In order to check the reactivity of these solutions in the dark, the time dependence of solution viscosity was measured by the use of a rotary viscometer (VISCONIC ELD, E type, 3° cone).

As a result, the solution viscosity scarcely changed even after 200 hours.

Examples 8 to 10

3 g of poly(vinyl carbazole), 0.2 g of iodoform, 0.2 g of each onium salt and 0.05 g of each sensitizer shown in Table 3 were dissolved in 60 g of a mixed solvent of chloroform:monochlorobenzene=1:1 in dark to form solutions, whereby photo-crosslinkable resin compositions of Examples 8 to 10 regarding the present invention were obtained.

In order to check the reactivity in the dark of these solutions, the time dependence of solution viscosity was measured by the use of a rotary viscometer (VISCONIC ELD, E type, 3° cone).

As a result, the solution viscosity scarcely changed even after 200 hours.

TABLE 2

| Example | Onium Salt | Sensitizer |
|---------|------------|------------|
| 6 | (t-Bu-C₆H₄)₂I⁺ I⁻ | bis-coumarin sensitizer with Et₂N groups |
| 7 | (t-Bu-C₆H₄)₂I⁺ BF₄⁻ | bis-coumarin sensitizer with Et₂N groups |

TABLE 3

| Example | Onium Salt | Sensitizer |
|---------|------------|------------|
| 8 | (t-Bu-C₆H₄)₂I⁺ PF₆⁻ | coumarin sensitizer with Et₂N and julolidine groups |

TABLE 3-continued

| Example | Onium Salt | Sensitizer |
|---|---|---|
| 9 | diphenyliodonium CF$_3$SO$_3^\ominus$ | (structure with Et$_2$N-phenyl-CH=CH-C(=O)-coumarin-julolidine) |
| 10 | diphenyliodonium I$^\ominus$ | (structure with julolidine-CH=CH-C(=O)-coumarin-julolidine) |

Comparative Example 1

3 g of poly(vinyl carbazole), 0.3 g of carbon tetraiodide, 0.03 g of hydroquinone as a dark reaction inhibitor were dissolved in 60 g of monochlorobenzene in the dark to form a solution.

The time dependence of solution viscosity was measured by the use of a rotary viscometer in the same manner as in Examples 1 to 3. As a result, the solution viscosity became $10^4$ cp or more after 50 hours, so that the measurement by the E type viscometer was impossible any more.

Examples 11 to 14

3 g or each polymer, 0.15 g of each onium salt, 0.1 g of each sensitizer shown in Table 4 were dissolved in 30 ml of chlorobenzene to obtain photosensitive resin compositions of the present invention.

TABLE 4

| Example | Polymer | Onium Salt | Sensitizer |
|---|---|---|---|
| 11 | Poly(vinyl-carbazole) | diphenyliodonium CF$_3$COO$^\ominus$ | (Et$_2$N-coumarin bis-methylidene julolidine structure) |
| 12 | Poly(p-chloro-styrene) | diphenyliodonium CF$_3$COO$^\ominus$ | (Et$_2$N-coumarin bis-methylidene julolidine structure) |
| 13 | Poly(p-bromo-styrene) | diphenyliodonium CF$_3$COO$^\ominus$ | (Et$_2$N-coumarin bis-methylidene julolidine structure) |
| 14 | Poly(p-methoxy-styrene) | diphenyliodonium CF$_3$COO$^\ominus$ | (Et$_2$N-coumarin bis-methylidene julolidine structure) |

Polyester film bases of about 100 μm in thickness were coated with these solutions, so that the thickness of each dry film might be 2 μm. This was followed by drying, to obtain recording media of the present invention.

Next, the thus-obtained recording media were exposed to Ar+ laser beams at 100 mJ/cm², further heated at 120° C. for 30 seconds, and then developed with dichloromethane. Afterward, unexposed portions were removed from the recording media to obtain relief patterns.

As a result, the obtained films could give the negative pattern, and a resolution of about 500 lines/mm could be achieved by the respective photosensitive materials.

Examples 19 to 18

0.19 g of iodoform was added to 3 g of each polymer and 0.1 of each sensitizer shown in Table 5, and the solution was dissolved in 30 ml of chlorobenzene to obtain photo-crosslinkable resin compositions of Examples 15 to 18 regarding the present invention.

Polyester film bases having a thickness of about 100 μm were coated with these solutions. This was so that the thickness of each dry film might be 2 μm. This was followed by drying, to obtain hologram recording media of the present invention.

Next, the thus-obtained recording media were exposed to Ar+ laser beams at 100 mJ/cm², further heated at 120° C. for 30 seconds, and then developed with dichloromethane. Afterward, unexposed portions were removed from the recording media to obtain relief patterns.

As a result, the obtained films could successfully give the negative pattern, and a resolution of about 500 lines/mm could be achieved.

Examples 19 to 23

0.2 g of iodoform, 3 g of each polymer, 0.2 g of each onium salt and 0.03 g of each sensitizer shown in Table 6 were dissolved in chlorobenzene and chloroform to obtain photo-crosslinkable resin compositions of the present invention.

Polyester film bases having a thickness of about 100 μm were coated with these solutions so that the thickness of each dry film might be 2 μm. This was followed by drying, to obtain hologram recording media of Examples 19 to 23 regarding the present invention.

Next, the thus-obtained recording media of the present invention were exposed to Ar+ laser beams at 100 mJ/cm², further heated at 120° C. for 30 seconds, and then developed with dichloromethane. Afterward, unexposed portions were removed from the recording media to obtain relief patterns.

As a result, the obtained films could successfully give the negative pattern, and a resolution of about 500 lines/mm could be achieved by the respective photosensitive materials

TABLE 5

| Example | Polymer | Sensitizer |
|---------|---------|------------|
| 15 | Poly-(vinylcarbazole) | |
| 16 | Poly-(p-chlorostyrene) | |
| 17 | Poly-(p-bromostyene) | |
| 18 | Poly-(p-methoxystyrene) | |

TABLE 6

| Example | Polymer | Onium Salt | Sensitizer |
|---|---|---|---|
| 19 | Poly(N-vinyl-carbazole) | [diphenyliodonium, I⁻] | [cinnamoyl coumarin with Et₂N and julolidine] |
| 20 | Poly(p-chloro-styrene) | [diphenylbromonium, PF₆⁻] | [bis-coumarin sensitizer with Et₂N and julolidine] |
| 21 | Poly(p-bromo-styrene) | [diphenylchloronium, PF₆⁻] | [bis-coumarin sensitizer with Et₂N and julolidine] |
| 22 | Poly(p-methoxy-styrene) | [diphenyliodonium, I⁻] | [bis-coumarin sensitizer with Et₂N and julolidine] |
| 23 | Poly(p-methoxy-styrene) | [diphenyliodonium, CF₃SO₃⁻] | [bis-coumarin sensitizer with Et₂N and julolidine] |

Comparative Example 2

The same procedure as in Example 23 was repeated, except that the polymer used in Example 23 was replaced with polystyrene, to form a relief pattern. However, the thus-formed film was hazy all over its surface, so that no relief pattern was obtained.

Examples 24 to 28

Glass substrates were coated with the solutions prepared in Examples 1 to 5, in the dark, by use of a spinner, followed by drying, to obtain films having a thickness of 8 μm.

These hologram recording media of the present invention were exposed to Ar⁺ laser beams having 488 nm at 100 mJ/cm², and the following steps were then carried out to obtain reflection holograms.

(1) The recording media were immersed in ethanol at 30° C. for 1 minute.
(2) They were immersed in m-xylene at 30° C. for 2 minutes.
(3) They were immersed in n-hexane at 30° C. for 2 minutes, and then dried.

Diffraction efficiencies of the thus obtained holograms are set forth in Table 7.

TABLE 7

| Example | Photosensitive Resin Composition | Diffraction Efficiecny % |
|---|---|---|
| 24 | Example 1 | 60 |
| 25 | Example 2 | 45 |
| 26 | Example 3 | 53 |
| 27 | Example 4 | 65 |
| 28 | Example 5 | 47 |

Examples 29 and 30

Glass substrates were coated with solutions prepared in Examples 6 and 7, in the dark, by the use of a spinner, followed by drying, to obtain films having a thickness of 8 μm.

The thus-obtained hologram recording media of the present invention were exposed to Ar⁺ laser beams having 488 nm at 100 mJ/cm², and the following steps were then carried out to obtain reflection holograms.

(1) The recording media were immersed in ethanol at 30° C. for 1 minute.

(2) They were immersed in m-xylene at 30° C. for 2 minutes.

(3) They were immersed in n-hexane at 30° C. for 2 minutes, and then dried.

Diffraction efficiencies of the obtained holograms are set forth in Table 8.

TABLE 8

| Example | Photosensitive Resin Composition | Diffraction Efficiency % |
| --- | --- | --- |
| 29 | Example 6 | 68 |
| 30 | Example 7 | 75 |

Examples 31 to 35

3 g of polyvinyl carbazole, 0.15 g of di-t-butyldiphenyliodonium iodide and 0.1 g of each sensitizing dye shown in Table 9 were dissolved in 60 g of a mixed solvent of monochlorobenzene:THF=1:3 in dark to form solutions, whereby photosensitive resin compositions of Examples 31 to 35 of the present invention were obtained.

Next, holograms were prepared from the thus-obtained photosensitive resin compositions in the same manner as in Examples 29 and 30. Diffraction efficiencies of the obtained holograms are set forth in Table 9.

Examples 36 to 38

Glass substrates were coated with the photo-crosslinkable resin composition solutions of the present invention prepared in Examples 8 and 10, in the dark, by the use of a spinner, followed by drying, to obtain films having a thickness of 8 μm.

The thus-obtained hologram recording media of the present invention were exposed to $Ar^+$ laser beams having 488 nm at 100 $mJ/cm^2$, and the following steps were then carried out to obtain reflection holograms.

(1) The recording media were immersed in ethanol at 20° C. for 1 minute.

(2) They were immersed in a mixture of m-xylene:acetone=10:1 at 20° C. for 2 minutes to decolor them.

(3) They were immersed in m-xylene at 35° C. for 2 minutes.

(4) They were immersed in m-hexane at 20° C. for 2 minutes, and then dried.

Diffraction efficiencies of the obtained holograms are set forth in Table 10.

TABLE 10

| Example | Photosensitive Resin Composition | Diffraction Efficiency % |
| --- | --- | --- |
| 36 | Example 8 | 75 |
| 37 | Example 9 | 90 |

TABLE 9

| Example | Sensitizer | Diffraction Efficiency % |
| --- | --- | --- |
| 31 | *(structure)* | 35 |
| 32 | *(structure)* | 40 |
| 33 | *(structure)* | 50 |
| 34 | *(structure)* | 60 |
| 35 | *(structure)* | 50 |

TABLE 10-continued

| Example | Photosensitive Resin Composition | Diffraction Efficiency % |
|---|---|---|
| 38 | Example 10 | 85 |

Examples 39 to 41

The same procedure as in Example 37 was repeated, except that each composition ratio of an onium salt to a halogen compound of a photo-crosslinkable resin composition used in Example 37 was changed as shown in Table 11, thereby obtaining holograms. Diffraction efficiencies of the obtained holograms are set forth in Table 11.

TABLE 11

| Example | Iodoform (g) | Onium Salt (g) | Diffraction Efficiency % |
|---|---|---|---|
| 39 | 0.1 | 0.3 | 30 |
| 40 | 0.3 | 0.1 | 80 |
| 41 | 0.4 | — | 70 |

According to the present invention described above, there can be provided a photo-crosslinkable resin composition and a hologram recording medium having excellent shelf stability and high sensitivity.

Furthermore, a volume phase hologram can be prepared from such a recording medium of the present invention by a series of steps in a hologram recording method of the present invention, and the resultant hologram will advantageously by colorless and have high transparency, a diffraction efficiency of at most 90% and a resolution of 500 lines/mm or more.

In addition, the hologram obtained by the present invention has such excellent stability as not to be affected by moisture and light at all. Therefore, there can be obtained a hologram having many superior properties as compared with a hologram prepared from a conventional hologram recording medium.

What is claimed is:

1. A photo-crosslinkable resin composition comprising (a) a polymer having an electron-donating group in a monomer unit, (b) a halogen-containing compound, (c) an onium salt and (d) at least one sensitizer selected from the group consisting of coumarin derivatives, rhodamine derivatives, thioxanthene derivatives and unsaturated cyclopentanone compounds, wherein the content ratio of the onium salt to the halogen-containing compound is in the range of about 1:10 to about 2:1.

2. The photo-crosslinkable resin composition according to claim 1 wherein the sensitizer is a coumarin derivative having at least one cyclic amine group.

3. The photo-crosslinkable resin composition according to claim 1, wherein the monomer unit of the polymer is a monomer having a p-position-substituted styrene or a carbazole group on the side chain.

4. The photo-crosslinkable resin composition according to claim 1 wherein the onium salt is a diaryliodonium salt, a diarylbromonium salt or a diarylchloronium salt.

5. The photo-crosslinkable resin composition according to claim 1 wherein the onium salt is a compound represented by the formula (A)

wherein each of X and X' is t-butyl, —$CH_3$, —$CH_2CH_3$, —$CH_2CH_2CH_3$, —F, —Cl, —Br or —$OCH_3$ (however X=X' or X≠X'); Y is I, Br or Cl; and Z is $I^-$, $BF_4^-$, $PF_6^-$, $SbF_6^-$, $CF_3SO_3^-$ or $AsF_6^-$.

6. The photo-crosslinkable resin composition according to claim 1 wherein the onium salt is a compound represented by the formula (A')

wherein each of X and X' is t-butyl, —$CH_3$, —$CH_2CH_3$, —$CH_2CH_2CH_3$, —F, —Cl, —Br or —$OCH_3$ (however X=X' or X≠X'); Y is I, Br or Cl; and Z is $I^-$, $BF_4^-$, $PF_6^-$, $SbF_6^-$, $CF_3SO_3^-$ or $AsF_6$.

7. The photo-crosslinkable resin composition according to claim 1 which has sensitivity in a visible band.

8. The photo-crosslinkable resin composition according to claim 1 wherein the amount of the halogen-containing compound is in the range of 1 to 50% by weight based on the weight of the component (a).

9. The photo-crosslinkable resin composition according to claim 1 wherein the amount of the onium salt is in the range of 1 to 100% by weight based on the weight of the component (a).

10. The photo-crosslinkable resin composition according to claim 1 wherein the amount of the sensitizer is in the range of 0.01 to 10% by weight based on the weight of the component (a).

11. A hologram recording medium comprising a substrate coated with a photo-crosslinkable resin composition comprising (a) a polymer having an electron-donating group in a monomer unit, (b) a halogen-containing compound (c) an onium salt and (d) at least one sensitizer selected from the group consisting of coumarin derivatives, rhodamine derivatives, thioxanthene derivatives and unsaturated cyclopentanone compounds, wherein the content ratio of the onium salt to the halogen-containing compound is in the range of about 1:10 to about 2:1.

12. The hologram recording medium according to claim 11 wherein the sensitizer is a coumarin derivative having at least one cyclic amine group.

13. The hologram recording medium according to claim 11 wherein the monomer unit of the polymer is a monomer having a p-position-substituted styrene or a carbazole group on the side chain.

14. The hologram recording medium according to claim 11 wherein the onium salt is a diaryliodonium salt, a diarylbromonium salt or a diarylchloronium salt.

15. The hologram recording medium according to claim 11 wherein the onium salt is a compound represented by the formula (A)

(A)

wherein each of X and X' is t-butyl, —CH$_3$, —CH$_2$CH$_3$, —CH$_2$CH$_2$CH$_3$, —F, —Cl, —Br or —OCH$_3$ (however X=X' or X≠X'); Y is I, Br or Cl; and Z is I$^-$, BF$_4^-$, PF$_6^-$, SbF$_6^-$, CF$_3$SO$_3^-$ or AsF$_6^-$.

16. The hologram recording medium according to claim 11 wherein the onium salt is a compound represented by the formula (A')

(A')

wherein each of X and X' is t-butyl, —CH$_3$, —CH$_2$CH$_3$, —CH$_2$CH$_2$CH$_3$, —F, —Cl, —Br or —OCH$_3$ (however X=X' or X≠X'); Y is I, Br or Cl; and Z is I$^-$, BF$_4^-$, PF$_6^-$, SbF$_6^-$, CF$_3$SO$_3^-$ or AsF$_6^-$.

17. The hologram recording medium according to claim 11, which has sensitivity in a visible band.

18. The hologram recording medium according to claim 11 wherein the amount of the halogen containing compound is in the range of 1 to 50% by weight based on the weight of the component (a).

19. The hologram recording medium according to claim 11 wherein the amount of the onium salt is in the range of 1 to 100% by weight based on the weight of the component (a).

20. The hologram recording medium according to claim 11 wherein the amount of the sensitizer is in the range of 0.01 to 10% by weight based on the weight of the component (a).

* * * * *

UNITED STATES PATENT AND TRADEMARK OFFICE
CERTIFICATE OF CORRECTION

PATENT NO. : 5,422,204

DATED : June 6, 1995

INVENTOR(S) : YOKO YOSHINAGA, ET AL.

Page 1 of 2

It is certified that error appears in the above-identified patent and that said Letters Patent is hereby corrected as shown below:

COLUMN 4

Line 46, "in" should be deleted.

COLUMN 7

Line 31, "$BF_4^- PF_6^-$," should read --$BF_4^-$, $PF_6^-$,--.
Line 43, "$BF_4^-$," should read --$BF_4^-$,--.
Line 44, "$PF_6^-$, $SbF_6^-$," should read --$PF_6^-$, $SbF_6^-$,--.

COLUMN 14

Line 7, "As, as" should read --As--.
Line 40, "dark" should read --the dark--.

COLUMN 16

Line 30, "dark" should read --the dark--.

COLUMN 18

Line 25, "or" should read --of--.

COLUMN 19

Line 12, "Examples 19" should read --Examples 15--.
Line 14, "0.19 g" should read --0.15 g--.
TABLE 5, "(p-bromostyene)" should read --(p-bromostyrene)--.

UNITED STATES PATENT AND TRADEMARK OFFICE
CERTIFICATE OF CORRECTION

PATENT NO. : 5,422,204
DATED : June 6, 1995
INVENTOR(S) : YOKO YOSHINAGA, ET AL.

It is certified that error appears in the above-identified patent and that said Letters Patent is hereby corrected as shown below:

COLUMN 22

TABLE 7, "Efficiecny %" should read --Efficiency %--.

COLUMN 26

Line 25, "$AsF_6$." should read --$AsF_6^-$.--.
LIne 47, "compound (c)" should read --compound, (c)--.

COLUMN 28

Line 14, "halogen containing" should read --halogen-containing--.

Signed and Sealed this

Twenty-sixth Day of September, 1995

Attest:

BRUCE LEHMAN

Attesting Officer     Commissioner of Patents and Trademarks